United States Patent
Naber

(10) Patent No.: US 9,490,387 B2
(45) Date of Patent: Nov. 8, 2016

(54) METHOD OF MANUFACTURING A SOLAR CELL AND EQUIPMENT THEREFORE

(71) Applicant: Tempress IP B.V., Vaassen (NL)

(72) Inventor: Ronald Cornelis Gerard Naber, Apeldoorn (NL)

(73) Assignee: Tempress IP B.V., Vaassen (NL)

( * ) Notice: Subject to any disclaimer, the term of this patent is extended or adjusted under 35 U.S.C. 154(b) by 120 days.

(21) Appl. No.: 14/379,480

(22) PCT Filed: May 3, 2013

(86) PCT No.: PCT/NL2013/050338
§ 371 (c)(1),
(2) Date: Aug. 18, 2014

(87) PCT Pub. No.: WO2013/165250
PCT Pub. Date: Nov. 7, 2013

(65) Prior Publication Data
US 2015/0040974 A1    Feb. 12, 2015

(30) Foreign Application Priority Data
May 4, 2012    (NL) ..................................... 2008755

(51) Int. Cl.
*H01L 31/18*    (2006.01)
*H01L 31/068*   (2012.01)
*H01L 31/065*   (2012.01)
*H01L 31/20*    (2006.01)

(52) U.S. Cl.
CPC ......... *H01L 31/1872* (2013.01); *H01L 31/065* (2013.01); *H01L 31/0682* (2013.01); *H01L 31/1804* (2013.01); *H01L 31/1864* (2013.01); *H01L 31/20* (2013.01); *Y02E 10/547* (2013.01); *Y02P 70/521* (2015.11)

(58) Field of Classification Search
CPC ............ H01L 31/065; H01L 31/0682; H01L 31/1872; H01L 31/1804; H01L 31/20; H01L 31/1864; Y02E 10/547; Y02P 70/521
USPC ........................................ 438/96; 250/492.21
See application file for complete search history.

(56) References Cited

U.S. PATENT DOCUMENTS

| 5,053,083 A * | 10/1991 | Sinton ............... H01L 31/03529 136/255 |
| 6,133,119 A | 10/2000 | Yamazaki |
| 2009/0227094 A1 | 9/2009 | Bateman et al. |
| 2011/0023956 A1 | 2/2011 | Harder |

(Continued)

FOREIGN PATENT DOCUMENTS

| DE | 4143084 A1 | 7/1993 |
| DE | 102008030880 A1 | 6/2009 |

(Continued)

*Primary Examiner* — Long K Tran
(74) *Attorney, Agent, or Firm* — Bret E. Field; Bozicevic, Field & Francis LLP

(57) ABSTRACT

Methods of manufacturing a solar cell are provided. Aspects of embodiments of the methods include introducing charge carriers into a substrate on a first side by ion implantation to produce an amorphized region followed by selectively recrystallizing material in part of the amorphized region to define a first recrystallized subregion and then at least partially removing recrystallized material from the first subregion. An apparatus for carrying out said method and a resulting solar cell having surface topology are also provided.

13 Claims, 6 Drawing Sheets

(56) References Cited

U.S. PATENT DOCUMENTS

2011/0139230 A1 6/2011 Rohatgi et al.
2013/0092975 A1* 4/2013 Jain ....................... B82Y 20/00
　　　　　　　　　　　　　　　　　　　　257/100

FOREIGN PATENT DOCUMENTS

| WO | 2011020124 A2 | 2/2011 |
| WO | 2011085177 A2 | 7/2011 |

* cited by examiner

METHOD OF MANUFACTURING A SOLAR CELL AND EQUIPMENT THEREFORE

FIELD OF THE INVENTION

The invention relates to a method of manufacturing a solar cell, said device comprising a semiconductor substrate with a first side and an opposed second side, at which first side an active region doped with charge carriers of a first conductivity type is defined selectively, comprising creating first and second subregions at the first side with a mutually different amount of charge carriers, whereto said charge carriers are introduced into the substrate on said first side by ion implantation, The invention also relates to a semiconductor equipment for the selective creation of an active region comprising charge carriers of a first conductivity type at a first side of a semiconductor substrate, said equipment comprising a ion implanter suitable for implantation at a dose level that induces surface amorphization of the semiconductor substrate to define an amorphized region.

The invention further relates to a solar cell comprising a semiconductor substrate with a first side and an opposed second side, at which first side an active region doped with charge carriers of a first conductivity type is defined selectively, said active region comprising a first subregion and a second subregion with a higher concentration of charge carriers than the first subregion.

BACKGROUND OF THE INVENTION

Advances in solar cell manufacturing require some kind of patterning of the doped regions, instead of the blanket diffusions that are now commonly used throughout the solar industry. For example, for a better front-side emitter performance with a lower amount of recombination losses in a standard silicon solar cell, one requires a higher doping underneath the metal contact area than in the non-contact area.

One method for patterning, used in combination with ion implantation, is known from WO2011/152982 A2. Herein, the patterning of doped regions is based on the use of shadow-masks that are installed inside the ion implanter. These masks can prevent or lower the exposure of certain parts of the solar wafers to the ion beam. After annealing the wafers will have a sheet resistance profile that has some kind of pattern along the wafer surface.

The technique has a disadvantage in that the installation and maneuvering of shadow masks inside the implanter adds to the complexity of the machine and therefore adds significant cost to the machine sales price. Through depreciation the additional machine complexity then adds to the cost of the produced solar cells.

Another disadvantage is that these shadow masks heat up quite a bit during continuous use in an ion implanter and will therefore generally change shape to some extent. For this reason there is a limit to how fine one can make patterns in this way. This is also important if one needs multiple shadow masks that have to have a certain alignment from one mask to the next. This situation occurs for instance when one is using a high-efficiency solar cell design called inter-digitated back-contact (IBC). In this design one places p- and n-type doped regions side-by-side in a complex inter-digitated pattern on the rearside of the wafers.

Another disadvantage of shadow masking is that the masks themselves cannot make any arbitrary shape because the mask needs to be able support itself. For this reason, the patterns made on the semiconductor substrates are limited in their design.

SUMMARY OF THE INVENTION

It is therefore an object of the invention to provide an improved method of manufacturing semiconductor devices, in particular solar cells, overcoming the said drawbacks.

It is another object of the invention to provide a method of manufacturing semiconductor devices such as solar cells wherein resolution of resulting patterns is not limited through the equipment needed therefore.

It is another object to provide an improved semiconductor equipment and use thereof, with reduced machine complexity. It is a further object of the invention to provide a solar cell with an interdigitated back contact (IBC) with appropriate resolution.

It is again a further object of the invention to provide a solar cell with improved device performance According to a first aspect of the invention, a method of manufacturing a semiconductor device, such as a solar cell, is provided, which device comprising a semiconductor substrate with a first side and an opposed second side, at which first side an active region doped with charge carriers of a first conductivity type is defined selectively, which method comprises the steps of:

Introducing said charge carriers into the substrate on said first side by ion implantation in an implantation step at a dose level that induces surface amorphization, therewith forming an amorphized region;

Selectively recrystallizing material in part of the amorphized region to define a first, recrystallized subregion, the remainder of the amorphized region defining a second subregion, and Removing at least partially the recrystallized material of the first subregion, therewith creating the selectively defined active region and inducing a surface topology between the first and the second subregion.

The invention is based on the insight that the structure of doped regions, being amorphous as a consequence of ion implantation, may be selectively recrystallised and thereafter selectively removed. As a result, the selective recrystallisation may be carried out with a high resolution, and in accordance with any desired pattern. In comparison with the known method using a shadow mask inside the ion implanter, the inventors of the present invention have understood that the resolution may be increased at least tenfold. This significant increase in resolution is achieved first of all, in that the shadow mask itself is no longer limiting resolution. Moreover, in view of the gradual degradation of the shadow mask at its edges due to the heating up, the prior art requires use of an error margin. According to the present invention, this error margin may be reduced or even left out.

In a most suitable embodiment, the selective recrystallisation is carried out with a selective anneal. Several forms of selective, e.g. local heating may be used; the most preferred one being heating by means of a beam source. A laser is an excellent example thereof, but alternatives include e-beam irradiation, heating by means of LED or other radiation sources, contacting the first regions to be crystallised with a hot (or heatable) element. When using radiation or light sources, the use of a mask to be applied on the semiconductor substrate is not excluded. Such a mask is preferably a separate unit, for instance a moulded body provided with holes.

The at least partial removal in accordance with the invention may be a partial removal, wherein the first region is removed to a first depth in the substrate, recrystallized material remaining beyond said first depth. This embodiment is for instance suitable for the generation of a selective emitter or a selective back surface field, wherein the second subregions will act as contact regions to conductors on top of the semiconductor substrate.

The at least partial removal is alternatively a full removal, partially by means of etching. If the structure is intended for use as a selective emitter or a selective back surface field, the full removal is to be followed with a subsequent doping step. This doping step is suitably a diffusion step. Alternatively, the full etch may be used for the provision of interdigitated back contacts (IBCs). As will be understood by the skilled person, the terms 'selective emitter' and 'selective back surface field' are herein used to define an emitter respectively a back surface field with a first lowly doped subregion and a second highly doped subregion (lowly doped and highly doped herein used relative to each other). The second highly doped subregion is intended as a contact region underneath a conductor material, particularly a metal or alloy. The first lowly doped contact region is present, since high doping results in significant recombination which has a negative impact on efficiency. It will be therefore clear to the skilled person that an increase in resolution may be used to reduce the size of the second highly doped subregion and therewith to increase efficiency of the solar cell.

Furthermore, the selective recrystallisation and at least partial removal may be applied for the generation of a selective front-surface fields. A front-surface field (FSF) is known per se in the art, and may be applied with or without contacts. In one suitable embodiment, the FSF, located at the front side, and without contacts, is combined with the provision of interdigitated back contacts (IBCs) at the rear side. The FSF, which preferably follows the front surface and any texture thereon, results in a cell with enhanced symmetry and better efficiency. Most suitably, the IBCs are coupled to a selective emitter and a selective back surface field, both located at the rear side. Most preferably, use is made of an n-type silicon substrate, with then p-type emitter, n-type BSF and n-type FSF. Suitably, the dopant level of the BSF is higher than that of the FSF, particularly in order to obtain a good contact.

The provision of a selective FSF has various benefits, also dependent on the implementation. If the front side is textured, the dopant could be removed locally, so as to make the FSF more straight. The tips of texturing, facing towards the rear side or away from it, may develop into weak points of the cell, where recombination could easily occur, or from where a shunt could develop (due to unexpected dopants). Removal of those tips then makes the solar cell more robust. Alternatively the FSF could be designed selectively, so as to be present opposite the emitter and/or the BSF. Moreover, it could be beneficial to subdivide the FSF into several portions, which are no longer connected to each other. Most suitably, the selective FSF comprises higher doped portions and lower doped portions. The higher doped portions provide better transport, while the lower doped portions are better for passivation. Such a selective FSF is suitably prepared with a partial removal as discussed above.

The implantation step of the present invention involves most preferably a substantially blanket implementation. This term 'substantially blanket' implantation is used, in the context of the present invention for an implantation that is blanket at a scale relative to the patterns defined by means of selective recrystallisation. However, it is not excluded that this implantation could include any masking so as to prevent side effects, for instance in order to prevent implantation outside the substrate surface area.

It is observed for clarity that the implantation step may comprise more than a single stage, and is tuned for optimum results. For instance, a first implantation species may be applied and optimized for surface amorphisation; a second implantation species may be applied and optimized for use as a charge carrier in the active region. Such stages are suitably carried out subsequently. Furthermore, a pre-treatment could be carried out, so as to facilitate the surface amorphisation and suitably to reduce the required dosage.

In again a further embodiment, the at least partial removal is an overetch treatment, such that also part of the substrate underlying the second, amorphous region is removed. The subsecond region is then present on top of a substrate support region and laterally protrudes beyond said substrate support region. This embodiment may be used for the same purposes as the full etch. If the second region is used as a contact region, this has the advantage of a relatively large contact area. If a further doping step by means of diffusion is applied, the relatively small support region provides the effect that the overall doping concentration therein may be higher than that achieved with merely a full etch. A further advantage of such overetched structure is that a subsequent layer may become anchored into the protruding second subregion. That can improve adhesion of the substrate and the subsequent layer, particularly a polymer layer.

The first side of the substrate at which the active region with the first and second subregions is formed, may be both the so-called front side of the substrate as well as the rear side of the substrate. In the processing of solar cells, the front side is typically the side intended for incoming irradiation. The front side is the side that is intended for receiving irradiation during use; the solar cell will be assembled on its rear side to a carrier. The front side typically has been texturized in advance of doping processes.

According to a second aspect of the invention, a semiconductor equipment is provided that is suitable and intended for the selective creation of an active region comprising charge carriers of a first conductivity type at a first side of a semiconductor substrate. The equipment comprises a ion implanter suitable for implantation at a dose level that induces surface amorphization of the semiconductor substrate to define an amorphized region. The equipment further comprises means for selective recrystallisation of said amorphized region of the semiconductor substrate.

The equipment of the present invention is less complex than the known equipment due to the absence of shadow masks within the equipment. In one suitable embodiment, the ion implanter is arranged to provide a blanket ion implantation. A further advantage is that heating up within the equipment is less an issue, enabling patterning with a higher resolution.

In a preferred embodiment, the means for selective recrystallisation comprise a source for local anneal that is movable or focussable across at least a portion of the semiconductor substrate. Such a source is particularly a beam source such as a laser source. More than one beam source may be available, so as to ensure the intended selective crystallisation in a sufficiently short duration of time. Rather than or in addition to the laser source being movable, a table on top of which the semiconductor substrate rests (i.e. the chuck), may be movable relatively to the laser source. This may be suitable so as to maintain a fine tuned position of the laser source. Herein, the chuck could be movable over longer distances, while the beam source is movable or focussable in a smaller area. Furthermore, the chuck could be movable in one direction whereas the laser source is movable in another direction, for instance substantially perpendicular to the movement direction of the chuck.

In a further implementation, the one or more beam sources may be disposed in a first rest position adjacent to the ion implanter and be movable to a second position within a ion implanter chamber between said ion implanter and said chuck. This has the advantage that the overall surface area of the equipment is minimum, while preventing the disturbance of ion implantation by said beam sources, and/or the damaging of said beam sources during ion implantation. The beam sources are for instance movable by means of a rail system attached to a wall of said ion implanter chamber.

The laser may be provided within the said ion implanter chamber, or be arranged so as to transmit irradiation into the chamber through a window made of an optically transparent material. Preferably, the arrangement is such to provide a relatively low power to the amorphized region. Substantial heating up of the chamber overall is preferably prevented; such heating up could give rise to more recrystallisation than desired.

The laser is suitably provided with driving means programmed for heating predefined portions of the amorphized surface, such that heating of the surface occurs during a short duration at a temperature of less than 700° C., for instance in the range of 500-700° C. The short duration is for instance less than 10 seconds, for instance 5 seconds.

In an alternative implementation, the equipment may contain a ion implantation chamber and a selective heating chamber, wherein the chuck is movable from the ion implantation chamber to the selective heating chamber. An advantage hereof is that the throughput time and/or volume may be optimized. For instance, while the first regions in the semiconductor substrate are recrystallised selectively in the selective heating chamber, a subsequent semiconductor substrate may be processed in the ion implantation chamber. Furthermore, a single ion implantation chamber may be provided with more than one selective heating chambers. This allows to do a ion implantation for several substrates simultaneously, that are thereafter processed individually.

It will be understood by the skilled person that the semiconductor equipment may contain any further chambers for other process steps. Particularly suitable chambers are for instance plasma etching and/or deposition chambers. These types of chambers are known per se to the skilled person. An example thereof is a deposition chamber for deposition of a glass layer, such as a glass layer, more particularly a phosphorous-silicate glass (PSG) or a borosilicate glass (BSG) known per se, from which dopants can be introduced into the substrate by means of diffusion. In the event that such a dopant will be introduced after the selective recrystallisation, its temperature is suitably kept low, so as to avoid an undesired full recrystallisation. The deposition chamber is then suitably a low-temperature deposition chamber. The term 'low' is herein understood to be used relative to the temperature of recrystallisation.

According to further aspects of the invention, solar cells are provided. As has been explained above, the first recrystallized region may be removed either partially or completely, and this may be used for different purposes such as selective emitter definition, selective back surface field definition, and the provision of interdigitated back contacts. For purpose of clarity, the resulting devices have been specified separately.

In one aspect, a solar cell is provided comprising a semiconductor substrate with a first side and an opposed second side, at which first side an active region doped with charge carriers of a first conductivity type is defined selectively, said active region comprising a first subregion and a second subregion with a higher concentration of charge carriers than the first subregion, wherein a surface topology is present in that the second subregion extends above the first subregion.

A first advantage of this structure, which is more specifically obtained in the method of the invention, is the comparatively high resolution of the second subregion. Therewith efficiency losses due to charge carrier recombination is reduced while nevertheless maintaining a large area first subregion having a significantly lower doping concentration. The active region of this aspect is more preferably a back surface field or an emitter.

A second advantage of this structure, is that the surface topology may facilitate contacting the second subregion. The higher doping concentration achieved in the second subregion is aimed at using it as a contact region, so that contacting thereof is relevant. Such facilitation could be either in the form of enabling optical detection of the second contact region, or in the form of selective exposure of the second contact region, for instance obtained through selective deposition of a surfacial layer. It is observed hereto, that optical detection will be primarily based on the topology rather than on the difference is structure; as in an anneal step subsequent to the creation of surface topology, any amorphized material will be recrystallized, so that the resulting surface will be fully crystallized.

The first subregion of the active region may be a region doped by ion implantation, by diffusion or by a combination of both. Dimensions as to the size of the second subregion as well as the created surface topology are open to design.

In another aspect, a solar cell is provided comprising a semiconductor substrate with a first side and an opposed second side, at which first side an active region doped with charge carriers of a first conductivity type is defined selectively, said active region comprising a first subregion being present on top of a substrate support region and laterally protruding beyond said substrate support region, wherein a surface topology is present in that the second subregion extends above a surface of the semiconductor substrate.

This solar cell is the result of overetching and has the advantage of creating a second subregion with a relatively large area suitable as contact region in comparison to the underlying substrate support. The lateral protrusion of the first subregion over the substrate 'neck' is suitable in view of the subsequent deposition of contacts, typically by means of low(er) resolution processes such as screen printing or electroplating that are suitable for assembly processes, and wherein resistive losses are to be as small as possible. Nevertheless, the structure still has a relatively small interface between the contact region and the rest of the substrate. This is suitable to reduce recombination losses that are known to reduce efficiency of the solar cell operation. A further advantage is that the lateral protrusion allows anchoring of subsequent layers and therewith better adhesion, particularly with layers of polymer materials.

In a favourable embodiment, the solar cell of this aspect is part of an arrangement of interdigitated back contacts, as known per se in the field. Particularly, the arrangement is provided with a resolution in the order of 50 microns, more preferably 25 microns or less, or even 10 microns or less. In again a further aspect, a solar cell is provided comprising a semiconductor substrate with a first side and an opposed second side, at which first side an active region doped with charge carriers of a first conductivity type is defined selectively, wherein a further region doped with charge carriers of a second conductivity type is defined adjacent to and isolated from said active region, and wherein the first side of the substrate comprises a surface topology such that the active region extends above the further region.

According to this embodiment, different active regions, intended as contacts are provided on a single side of the substrate. The surface topology creates here an inherent distinction between the contacts of opposite polarity, which is useful for providing a sufficient electrical isolation. More particularly, the active region may be provided with an electrical insulation on its side faces. This electrical insulation may be obtained by means of thermal oxidation. Due to the enhanced dopant concentration in the active region, the thermal oxidation grows to a larger thickness on the side faces than outside the active region. The thermal oxidation on the side faces will therefore be maintained upon opening the thermal oxidation outside the active region. The thermal oxidation thereto constitutes a self-aligned and highly reliable insulation between the contacts of opposite polarity. Thus, most suitably, no p-n junction is formed between said active region and said further region. Therefore, the resulting solar cell suitably comprises an insulation between the active region and the further region of opposite polarity. Furthermore, the active region is suitably provided with a thermal oxide on its surface. This thermal oxide preferably has a larger thickness on the active region. This thermal oxide more preferably extends on side faces of the active region. In a further embodiment, the thermal oxide may be used as a structure for selective deposition of a resist, so as to define a cavity for subsequent deposition of contact material, for instance by means of screen printing or by means of electroplating.

BRIEF INTRODUCTION OF THE FIGURES

These and other aspects of the method and the device of the invention will be further elucidated with reference to the Figures in which.

DETAILED DESCRIPTION OF ILLUSTRATIVE EMBODIMENTS

Figure 1A:
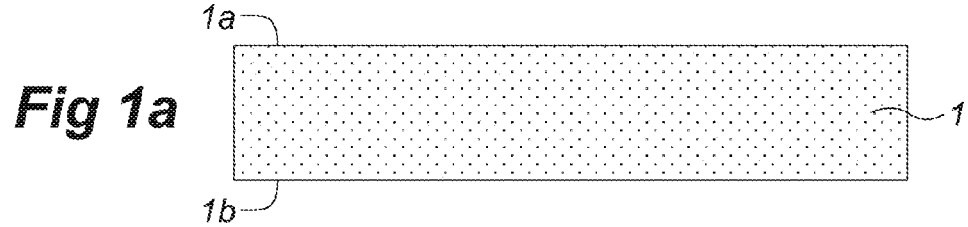
FIG. 1a-1e show in cross-sectional view a first embodiment of the method of the invention.

The Figures are diagrammatical in nature and not drawn to scale. The Figures are purely intended for illustrative purpose. Equal reference numerals in different Figures refer to same or similar elements.

Figure 1B:
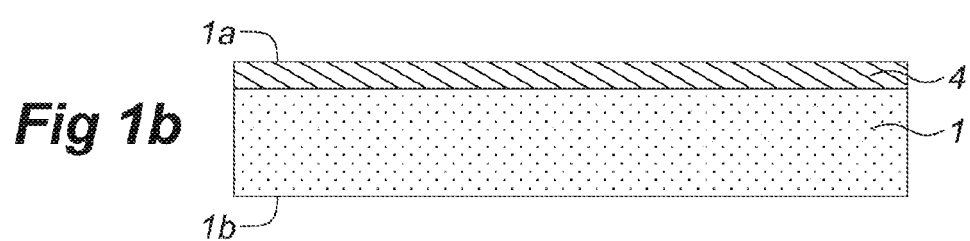
Figure 1C:
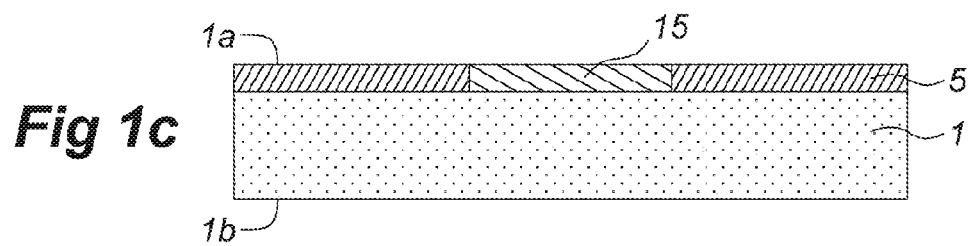

FIG. 1a-c shows in a cross-sectional view a first embodiment of the method, resulting in a partial removal of the first subregion to a predefined depth.

FIG. 1a shows a semiconductor substrate 1 with a first side 1a and a second side 1b. The semiconductor substrate 1 is preferably a silicon substrate, such as a multicrystalline substrate or most preferably a monocrystalline silicon substrate that is doped with either n-type or p-type charge carriers as known per se to the skilled person. The semiconductor substrate suitably has a thickness of up to 200 micrometers. In the event that the semiconductor substrate is intended for the manufacture of a solar cell, the side 1a, 1b of the substrate 1 being intended for use as the front side is typically texturized in known manner. The second side 1b may be provided in advance with a dopant, for instance by means of boron diffusion from a boron silicate glass (BSG). Any glass or contaminant present on the first side is suitably removed by etching in advance of the process module shown here.

FIG. 1b shows the semiconductor substrate 1 after ion implantation at a dose that induces surface amorphisation, resulting in an active region 4. Preferably, use is made of phosphorus ions. Here, the dose range typically used for solar cell applications (with a resulting dopant concentration higher than $2 \cdot 10^{15}/cm^2$) induces surface amorphization. The layer thickness of the amorphized region is typically less than 1 micron, suitably in the order of 100-500 nm, for instance around 200 nm. Alternatively, use may be made of arsenic (As) or of $BF_2$. However, phosphorus is deemed most beneficial as the currently achievable ion beam current is comparatively high. The implantation step may comprises various stages, for instance a first stage in which an implantation is carried out with a first species resulting in amorphisation. In a second stage, an implantation is carried out with a second species resulting in doping. This two-stage implantation is particularly suitable in combination with boron as the second species. The first species is suitably a dopant such as gallium or indium (in combination with the use of a silicon substrate) and therewith provides a contributes to the doping level, which is relevant for quality. However, the implantation step may also be carried out in the sense that the first species is not a dopant, but provided at a dose level that induces surface amorphisation. The charge carrier is provided in the second stage of the implantation step. Substrates are typically loaded into a first vacuum chamber on a tray. After reaching a suitable pressure the tray is carried forward to a ion beam processing area, where the wafers are exposed to the ion beam. Finally, the tray is transported to a third chamber for repressurization and load-out.

FIG. 1c shows the semiconductor substrate 1 after local recrystallisation. This is for instance carried out by heating up the surface to 500-1000° C., for instance 600-800° C. Advantageously, this is done with a laser beam, but other techniques such as contacting with a hot surface are feasible as well. As a result thereof, the active region is subdivided into a first recrystallised subregion 5 and a second amorphous subregion 15. The time needed for recrystallisation may depend on the chosen temperature and the laser beam, but may be in the order of seconds up to minutes. Use is suitably made of a pulsed laser, such as a YAG or Ruby laser. Suitable settings of a ruby laser include a spot diameter of 6 mm at half power, half width of pulse duration of 25 ns, a power density up to 2 $J/cm^2$, for instance 0.5 to 1.5 $J/cm^2$, and a repetition rate of for instance 10 pulses per minute. Ultrafast laser pulses of for instance 60-120 fs and a wavelength of $\lambda=800$ nm may be used alternatively, particularly for thinner subregions in the order of 100 nm.

Figure 1D:
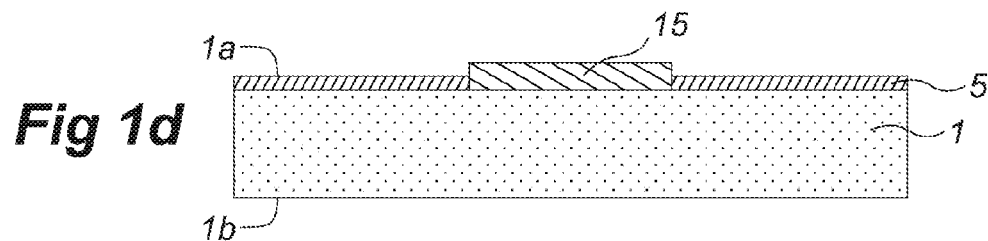

FIG. 1d shows the semiconductor substrate 1 after a partial etch of the first recrystallised subregion 5.

Advantageously, the etching is done using an alkaline solution, but alternatives such as nitric acid and hydrofluoric acid may also work. When used on a textured surface, the alkaline solution preferably comprises a texturizing additive. Such a texturing additive, such as for instance a lower alcohol fully miscible with the alkaline solution, more preferably isopropanol, is known for inducing texturisation, more precisely the formation of random pyramids that represent the <111> crystal plane. The use of an alkaline solution with a texturing additive has the advantage that the etching does not affect, at least not substantially, the optical properties of the texture. Suitably, the etching is followed by a surface cleaning step. This is deemed particularly suitable in case of using an alkaline etching solution comprising sodium or potassium ions. Cleaning steps are known per se in the field and comprise for instance an HCl rinse.

Figure 1E:
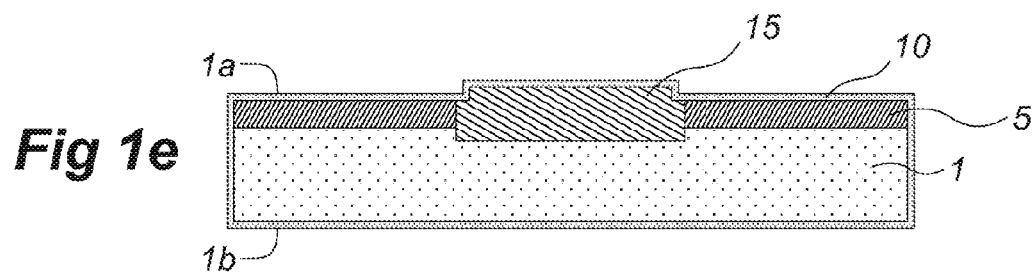

In a subsequent step (not shown), the semiconductor substrate is thermally annealed in a furnace. This activates the implanted dopants and leads to diffusion of the dopants into the semiconductor substrate. A surface oxide is optionally grown. Moreover, the remaining amorphized second subregion is recrystallized in this step, at least substantially. The result thereof is shown in FIG. 1e. Rather than a thermal anneal, a high-temperature diffusion step could be carried out to add dopant, which will also result in recrystallisation of the remaining amorphized second subregion.

Rather than merely applying the process on one side of the substrate, it could be applied on both sides. In such a case, the implanted dopant on the one side is suitably n-type, such as phosphorous, whereas the implanted dopant on the other side is suitably p-type, such as boron. The boron implant is herein combined with a first implanted species to achieve amorphisation. The application of the process on both sides is for instance suitable to create a selective emitter on one side, and a selective back surface field (BSF) on the other side of the substrate.

Further process steps may be carried out, typically involving the provision of further doped regions at the second side of the substrate, the provision of an antireflection coating and the provision of conductors, as known per se to the skilled person. In case of that the active region shown in FIG. 1 constitutes a selective emitter, a back surface field is suitably obtained by doping the substrate from the second side with a printed aluminum paste and a firing step, as known per se to the skilled person.

Figure 2:
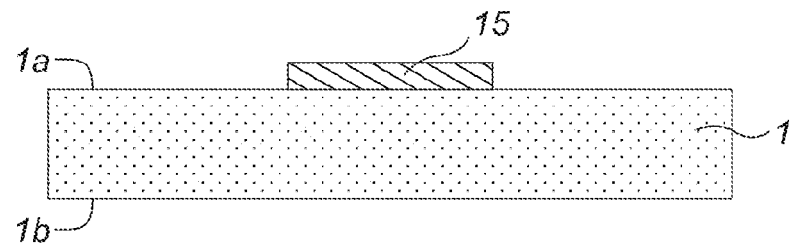
FIG. 2 shows in cross-sectional view a second embodiment of the method of the invention.

FIG. 2 shows a structure corresponding to FIG. 1d, however after that a full etch has taken place. The manufacturing process corresponds to the process discussed with reference to FIG. 1a-1d. In order to arrive at a structure corresponding to FIG. 1e, a further doping step is carried out. If the ion implantation is carried out with phosphorus or arsenic, the further doping step is suitably carried out with phosphorus, for instance from a phosphorus silicate glass (PSG) by means of a POCl$_3$ vapour as known in the art. The resulting glass is thereafter removed. In one embodiment, the resulting glass is removed partially, so as to expose the second subregion only. As will be understood by the skilled person, the separate provision of a thermal oxide is not deemed necessary in this situation.

Figure 3:
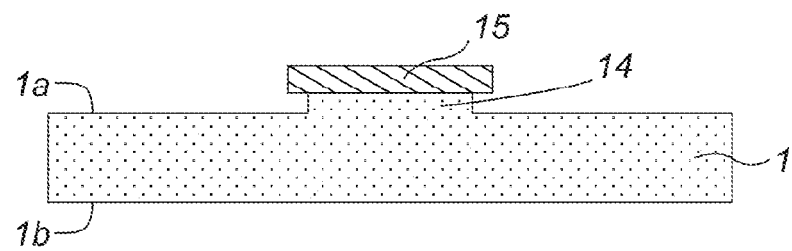
FIG. 3 shows in cross-sectional view a third embodiment of the method of the invention.

FIG. 3 shows a structure corresponding to FIG. 1d, however after that an over etch has taken place. In the resulting structure, the second subregion 15 is present on top of a substrate support region 14 and laterally protrudes beyond said substrate support region 14. The over etch is most suitably carried out with an alkaline solution, such as potassium hydroxide. Duration of the etching operation may be determined in test experiments and depends on concentration of the etchant, desired extent of over etching. Typically the lateral protrusion of the second subregion 15 over the substrate support region 14 is 100-200 nm.

Figure 4A:
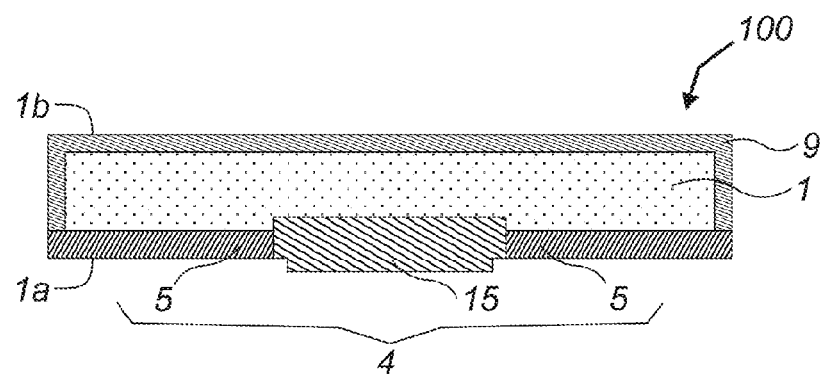
FIG. 4a-4b show in cross-sectional views a method of manufacturing a solar cell with front side and rear side doping.
Figure 4B:
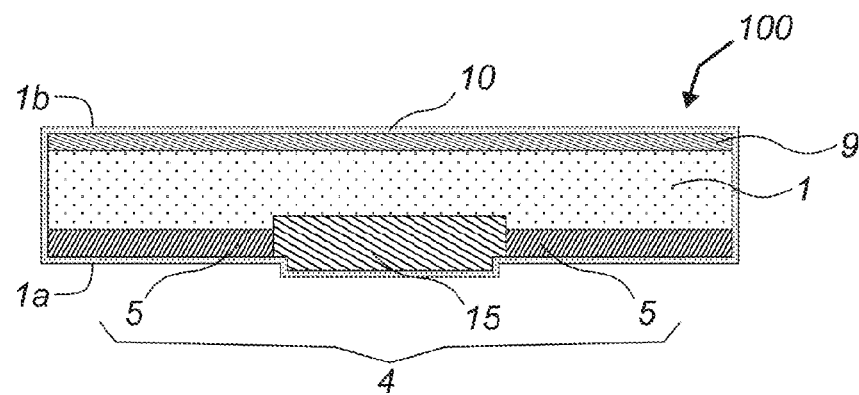

FIG. 4a-4b shows a solar cell in accordance with the invention, and made in accordance with the process of the invention. As shown in FIG. 4a, the solar cell 100 comprises a semiconductor substrate 1 with a first side 1a and a second side 1b. In this embodiment, the first side 1a constitutes the so-called rear side, and the second side 1b constitutes the so-called front side provided with a texture and suitable for receipt of incident light. The active region 4 comprises here a first subregion 5 and a second subregion 15 with a surface topology, such that the second subregion 15 extends above the first subregion 5, when seen in the plane of the first side 1a. The active region 4 at the first side 1a herein constitutes a selective back surface field. A further doped region 9 is provided at the second side 1b. This doped region 9, of opposite polarity to the active region 4, constitutes an emitter. Most suitably, the active region 4 is n-type doped, the further doped region 9 is p-type doped and the substrate is n-type doped, but alternative doping configurations are not excluded. The emitter is suitably formed by means of diffusion, for instance from a boron silicate glass (BSG) with a BBr$_3$ vapour as known to the skilled person. This diffusion could be carried out either prior to or after the creation of the active region 4.

Figure 5:
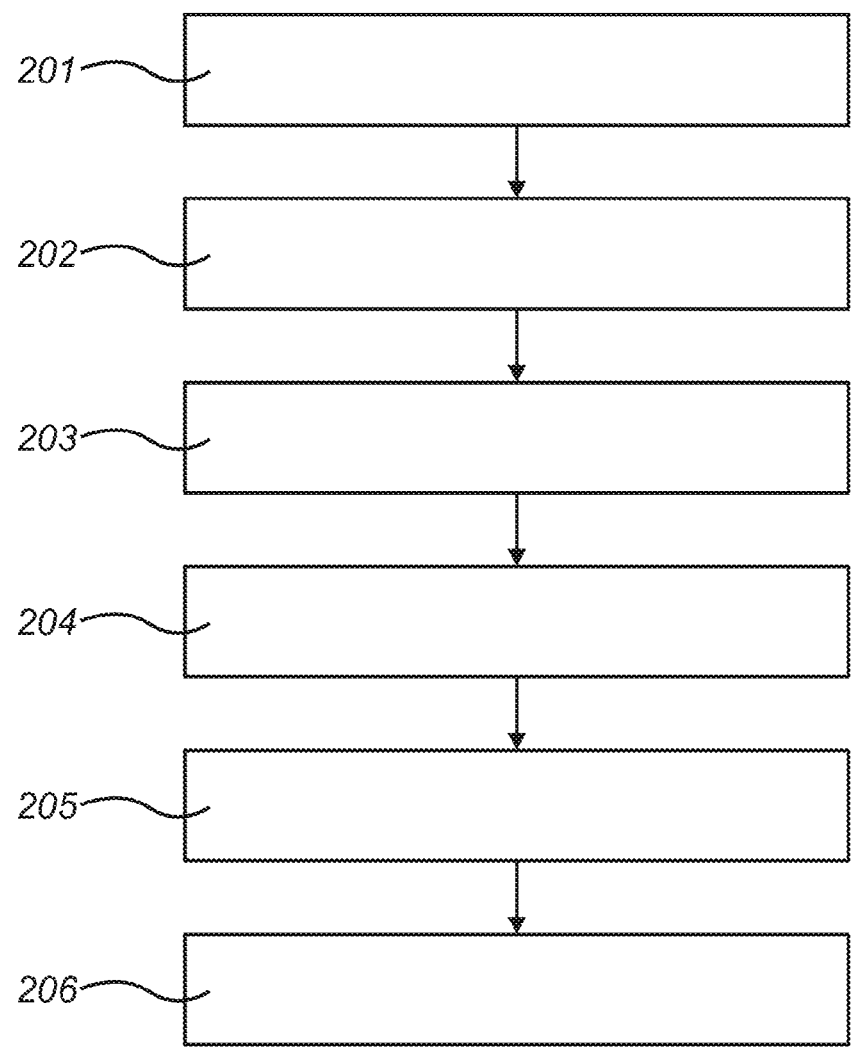
FIGS. 5 and 6 show flow diagrams for manufacturing several the solar cells shown in FIGS. 4a and 4b.

The solar cell 100 may be provided with a thermal oxide 10 for passivation purposes. Subsequently, the solar cell will be provided with an antireflection coating, for instance of silicon nitride, and with a metallisation pattern. One advantage of the present invention, is that the surface topology may facilitate contacting of the second subregion 15. The surface topology may for instance be detected optically. Therewith, further contacting material may be applied precisely, even when using printing techniques. This is deemed particularly suitable on a textured side. Furthermore, the surface topology could be exploited to obtain a selectively exposed second subregion 15 for use as a contact region. For instance the surface topology could be used to deposit, by printing, spin- or webcoating, a thin layer on the first subregion, which does not cover the second subregion 15. Therewith a difference in surface energy (hydrophobic versus hydrophilic surface area) is achieved, allowing a selective deposition on either the first subregion or the second subregion. Such a thin layer could further be a so-called primer for improved adhesion This is deemed particularly useful on a non-textured side. The structure shown in FIG. 4a is obtained in a process as shown in FIG. 5, wherein the doping on the second side 1b from a boron silicate glass was carried out after the implantation and the selective recrystallisation steps. The active region 4 and the further doped region 9 contact each other at the side faces of the semiconductor substrate 1, as shown in FIG. 4a. It will be apparent to the skilled person that the dopant at the side faces and/or at either the first side or the second side preferably near to such side faces is subsequently to be removed in order to isolate the emitter from the back surface field. This may for instance be carried out with a plasma treatment, or in any other known manner. Furthermore, a passivation is to be applied on the structure as shown in FIG. 4a, which is—in one suitable embodiment—a combination of a thermal oxide and a silicon nitride layer.

Figure 6:
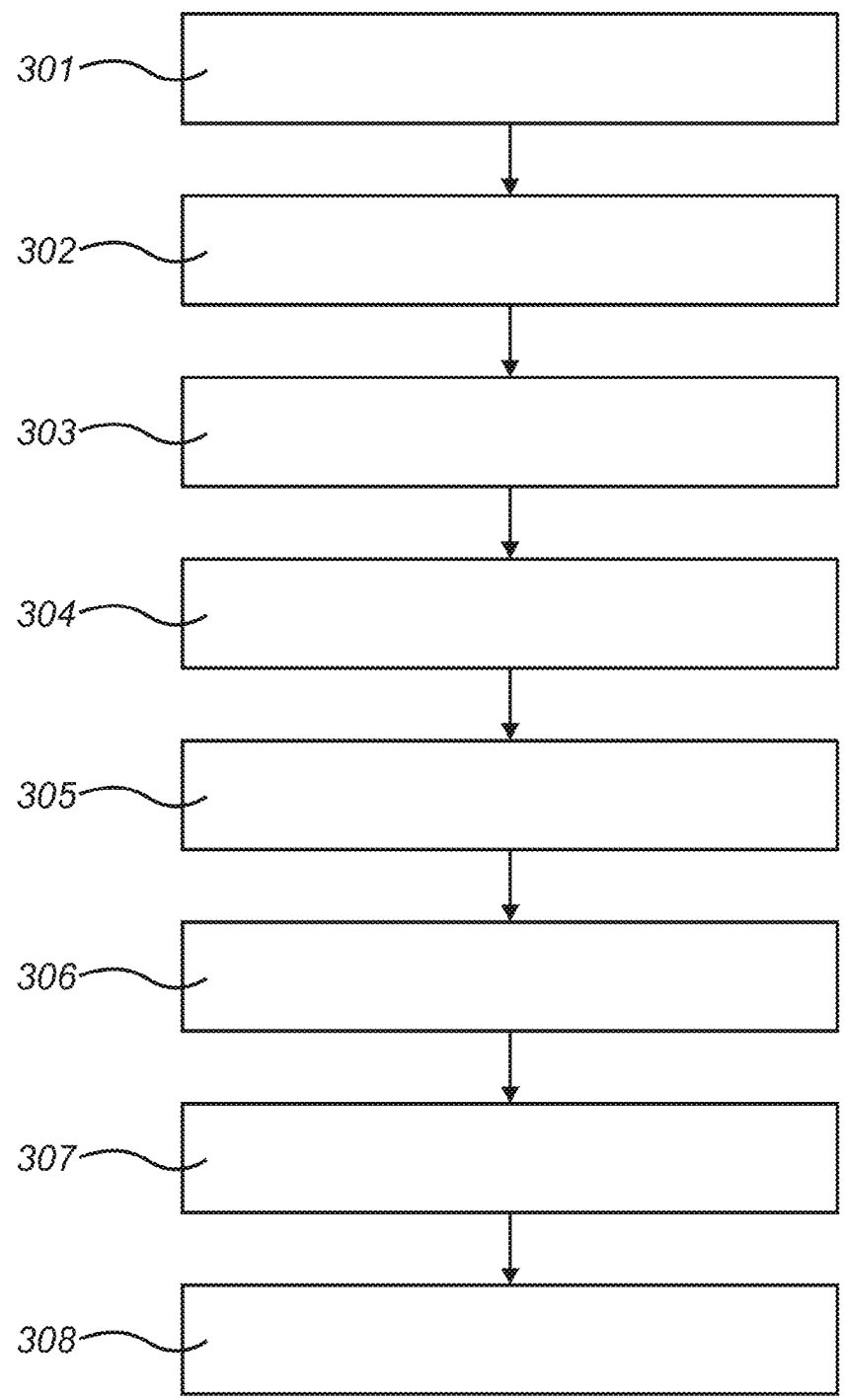

The structure as shown in FIG. 4b is obtained in a process flow as shown in FIG. 6, wherein the doping on the second side 1b from a boron silicate glass was carried out before the implantation and the selective recrystallisation steps. The advantage hereof, is that the boron doping deposited on the side faces of the substrate 1 may be removed in a 'single side etch' that is carried out directly after said boron doping, simultaneously with the removal of any boron doping deposited at the first side 1a of the substrate 1. FIG. 5 shows in a flow diagram the process for manufacturing the solar cell shown in FIG. 4a. In a first step 201, texturing is applied to the semiconductor substrate 1, and especially to the front side hereof, which is in the structure of FIG. 4a the second side 1b.

In a second step 202, a blanket ion implantation is carried out so as to define the active region 4 at the first side 1a of the substrate 1. This ion implantation is carried out at a dose to make the active region 4 amorphous.

In a third step 203, the active region 4 is locally recrystallized, therewith defining at least one recrystallized, first subregion 5 and at least one amorphous, second subregion 15.

In a fourth step 204, a wet-chemical etch is applied, which selectively removes the at least one recrystallized, first subregion 5. In this process flow, the wet-chemical etch is a partial etch, as shown in FIG. 1d.

In a fifth step 205, a diffusion step is carried out on the second side 1b, so as to diffuse charge carriers of a charge carrier type opposed to those implanted at the first side 1a. The diffusion is preferably carried out in known manner, wherein a boron vapour, for instance $BBr_3$ is deposited on the substrate 1 resulting in the formation of a boronsilicate glass (BSG), and the boron thereafter diffuses from the BSG into the substrate 1 by means of an anneal.

In a sixth step 206, the boron silicate glass is removed from the second side 1b. Further layers may be thereafter be formed and deposited in known manner.

FIG. 6 shows an flow diagram for forming the solar cell 100 as shown in FIG. 4b.

In a first step 301, texturing is applied again.

In a second step 302, a diffusion step is carried out on the second side 1b. As stated above, this diffusion step is for instance a boron diffusion step, that suitably comprises both the formation of a boron silicate glass (BSG) and the diffusion of the boron into the semiconductor, particularly silicon, substrate 1 by means of an anneal.

In a third step 303, a cleaning step is carried out on the first side 1a. This cleaning step 303 is more precisely an etching step, so as to remove any dopant resulting from the diffusion step 302. However, this cleaning step is merely applied to the first side 1a and not to the second side 1b, in a way that ensures that the silicate glass on the side 1b, particularly the boron silicate glass, is not removed. The presence of the (boron) silicate glass at the second side 1b furthermore allows laying down the substrate 1 with its second side 1b on a wafer table, i.e. a chuck. The boron silicate glass will be removed afterwards, such that any contamination, cracks and damage to the silicate glass do not negatively affect the performance of the resulting solar cell. Moreover, if desired or needed, any planarisation layer may be deposited on top of the silicate glass, so that the substrate 1 can lie on its second side 1b without risking breakage due to local pressure on the texture.

In a fourth step 304, a blanket ion implantation is carried out at the first side 1a to form an amorphized active region 4. Thereafter, in a fifth step 305, local recrystallisation of the active region 4 is carried out, so as to form at least one recrystallized first subregion 5 and at least one amorphous second region 15. In a sixth step 306, the first subregion 5 is partially removed by means of etching, for instance wet-chemical etching. Advantageously, the silicate glass on the side 1b protects the existing diffusion on the second side 1b during the wet-chemical etching step 306.

In a seventh step 307, after that the substrate 1 is removed from the chuck, the silicate glass is removed. This removal step may be preceded by an anneal step.

In an eighth step 308, thermal oxidation is applied.

Figure 7:
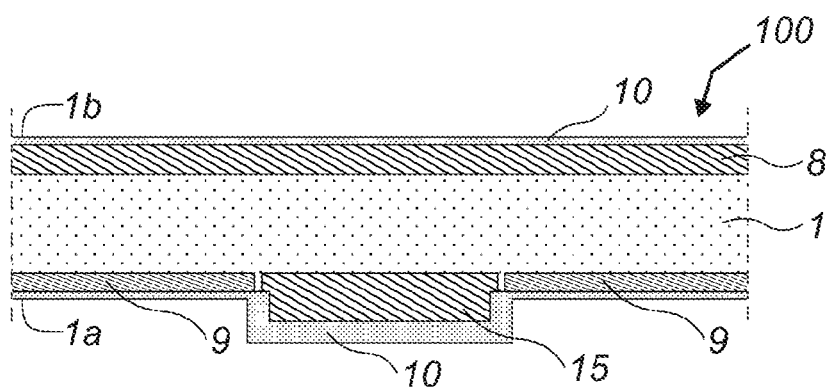
FIG. 7 shows in cross-sectional view a solar cell with interdigitated back contacts.
Figure 8:
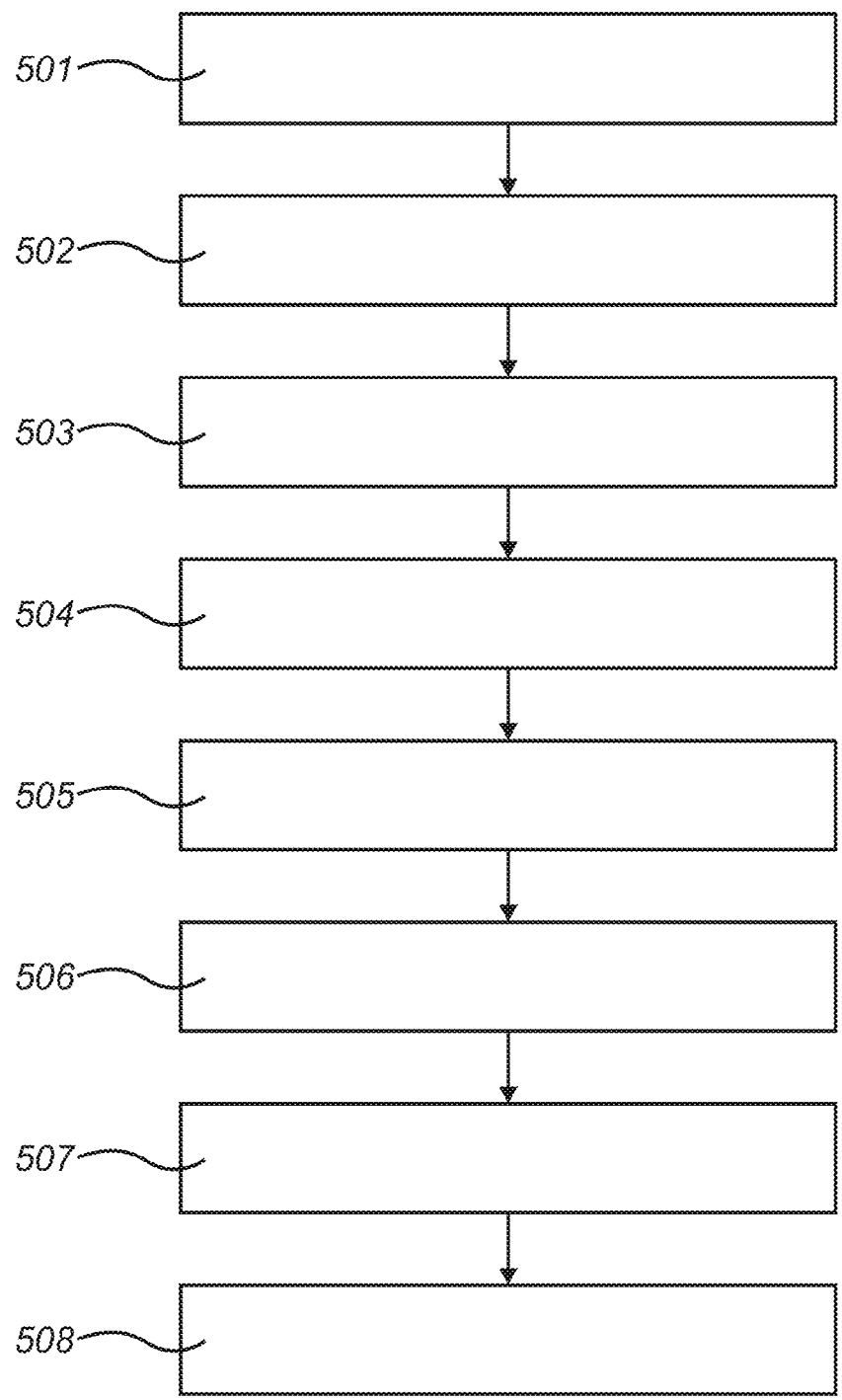
FIG. 8 shows a flow diagram for manufacturing the solar cell shown in FIG. 7

FIG. 7 shows in cross-sectional view a further embodiment of a solar cell 100 in accordance with the invention. FIG. 8 shows a flow diagram for manufacturing the shown solar cell 100.

This solar cell comprises a first active region 15 with charge carriers of a first conductivity type and a further region 9 comprising charge carriers adjacent to each other on the first side 1a of the substrate 1, which is intended for use as the rear side and coupling to a carrier. Most suitably, the further region 9 comprises charge carriers of a second conductivity type that is opposed to the first conductivity type. I.e. if the first conductivity type is p+, the second conductivity type is n+ and vice versa. A surface topology is present at the first side 1a, such that the first active region 15 extends above the second active region 9, when viewed with the first side 1a oriented upwards. Schematically, the FIG. 7 shows an interdigitated back contact cell (IBC). This type of solar cell has the advantage of allowing the rear junction to be optimized for electrical performance and having no shadow losses from metallization applied onto the frontside. Typically, interdigitated p+ and n+ doped regions are present at the rear side (here the first side 1a).

The shown device may be manufactured in that the recrystallized first subregion 5 (as shown in FIG. 1c) is completely removed, suitably including an over etch. The second subregion 15 will remain, and be used as a first contact region. Thereafter, in the shown implementation, the substrate 1 is oxidized thermally, which results in a thicker oxide on the second subregion 15, in comparison to the areas corresponding to the removed first subregions 5. In a subsequent step in accordance with this embodiment of the inventive method, a selective exposure of the semiconductor substrate 1 is then achieved. This exposure is in the shown implementation achieved by etching back the grown oxide. In view of the difference thickness across the semiconductor substrate, the areas corresponding to the first subregions will be exposed quicker, and may thus be exposed selectively. It will be understood that alternative implementations of selective exposure are not excluded, even though that the shown implementation is essentially self-aligned and industrially viable. For instance, rather than opting for a self aligned implementation by partial etching, selective exposure may be achieved by screen-printing of an etching paste. Such an alternative would have the advantage that the distance between the active regions can be controlled actively.

A further doped region will then be created in the exposed portion of the semiconductor substrate 1. Various methods are known for doping a region of the semiconductor substrate. Options include diffusion from the vapour phase, for instance through the intermediate of a silicate glass; the use of a further implementation, or the selective deposition of charge carriers from a precursor by a deposition technique such screen- or inkjet-printing, followed by diffusion step.

This device may be manufactured in according with the process flow shown in FIG. 9. In a first step 501 texturing is applied, at least on the second side 1b. In a second step 502, a blanket implantation is carried out. This blanket implantation is carried out both to the first side 1a and the second side 1b of the substrate 1, resulting in an active region at the first side 1a and a doped region 8 at the second side 1b. Advantageously, the implant dose on the second side 1b to make the front surface field will be lower than that for the back surface field on side 1a. It will be understood that a simultaneous implantation on the first side 1a and on the second side 1b may be advantageous for minimizing process steps, but is not strictly necessary. The doped region 8 could be alternatively provided in a diffusion step, resulting in the formation of a borosilicate glass or a phosphor-silicate glass dependent on the chosen dopant.

Steps 503 and 504 involve the local crystallisation and selective removal of the recrystallized material. In this embodiment, the recrystallized material will be removed completely, for instance in a full etch or an over-etch. In step 505 a thermal oxide is applied, resulting in an oxide that has a larger thickness on top of the second subregion 15 than in an area where the first subregion was removed in the preceding step. The oxidation step is followed in step 506 by a partial oxide etch applied selectively to the side 1a, so as to selectively expose the substrate in said areas where the first subregion was removed. The second subregion 15 remains covered under the thermal oxide. Thereafter, in step 507, charge carriers are introduced. Finally, in step 508, a thermal oxide is applied.

The invention claimed is:

1. A method of manufacturing a solar cell comprising a semiconductor substrate with a first side and an opposed second side, at which first side an active region doped with charge carriers of a first conductivity type is defined selectively, which method comprises the steps of:
   Introducing said charge carriers into the substrate on said first side by ion implantation in an implantation step at a dose level that induces surface amorphization, therewith forming an amorphized region;
   Selectively recrystallizing material in part of the amorphized region to define a first recrystallized subregion, a remaining part of the amorphized region defining a second subregion; and
   Removing at least partially the recrystallized material of the first recrystallized subregion, therewith creating the selectively defined active region and inducing a surface topology between the at least partially removed first subregion and the second subregion;
   wherein either:
   (a) the removal step is a partial removal, such that the recrystallized material is removed to a first depth in the substrate, recrystallized material remaining beyond said first depth; or
   (b) substantially all of the recrystallized material is removed.

2. The method as claimed in claim 1, wherein the implantation step involves a substantially blanket implantation.

3. The method as claimed in claim 1, wherein the selective recrystallization is carried out with a beam source, such as a laser.

4. The method as claimed in claim 1, wherein the at least partial removal step is carried out with wet-chemical etching.

5. The method as claimed in claim 4, wherein the wet-chemical etching is carried out with a solution comprising a texturing additive.

6. The method as claimed in claim 1, wherein the removal step is a partial removal, such that the recrystallized material is removed to a first depth in the substrate, recrystallized material remaining beyond said first depth.

7. The method as claimed in claim 1, wherein substantially all the recrystallized material is removed.

8. The method as claimed in claim 7, wherein an over-etch is applied, resulting in a structure, in which the second subregion is present on top of a substrate support region and laterally protrudes beyond said substrate support region.

9. The method as claimed in claim 1, wherein the active region constitutes a selective emitter or a selective back surface field.

10. The method as claimed in claim 1, further comprising diffusing charge carriers of the same conductivity type as those implanted in the implantation step into said first and second subregions of the substrate, said diffusion being carried out after the at least partial removal of the recrystallized material.

11. The method as claimed in claim 8, further comprising the steps of;
   Covering the first side of the substrate with a passivation layer;
   Selectively exposing the substrate in or within the first subregion, and;
   Introducing charge carriers into said exposed area of the substrate in or within the first subregion.

12. The method as claimed in claim 11, wherein the passivation layer is an oxide formed by oxidation of the substrate, having a larger thickness on the second subregion than on the first subregion, and wherein the selective exposure of the substrate results from etching back the oxide.

13. The method as claimed in claim 11, wherein the thus introduced charge carriers are of a second conductivity type, the exposed area of the substrate being defined so as to achieve an isolation between the charge carriers of the first type in the second subregion and those of the second type in or within the first subregion.

* * * * *